United States Patent
Youtsey et al.

(10) Patent No.: US 8,993,873 B2
(45) Date of Patent: Mar. 31, 2015

(54) SOLAR CELL WITH A BACKSIDE VIA TO CONTACT THE EMITTER LAYER

(75) Inventors: Christopher Youtsey, Libertyville, IL (US); Francis Tuminello, Chicago, IL (US); Victor C. Elarde, Evanston, IL (US)

(73) Assignee: MicroLink Devices, Inc., Niles, IL (US)

( * ) Notice: Subject to any disclaimer, the term of this patent is extended or adjusted under 35 U.S.C. 154(b) by 406 days.

(21) Appl. No.: 12/626,522

(22) Filed: Nov. 25, 2009

(65) Prior Publication Data

US 2010/0126573 A1  May 27, 2010

Related U.S. Application Data

(60) Provisional application No. 61/118,296, filed on Nov. 26, 2008.

(51) Int. Cl.
| | | |
|---|---|---|
| H01L 31/00 | (2006.01) |
| H01L 31/0224 | (2006.01) |
| H01L 31/0687 | (2012.01) |
| H01L 31/0725 | (2012.01) |
| H01L 31/078 | (2012.01) |

(52) U.S. Cl.
CPC .... *H01L 31/022441* (2013.01); *H01L 31/0687* (2013.01); *H01L 31/0725* (2013.01); *H01L 31/078* (2013.01); *Y02E 10/52* (2013.01); *Y02E 10/544* (2013.01)
USPC .......................................... 136/255; 136/256

(58) Field of Classification Search
USPC ........................ 136/243, 244, 252, 255, 256
See application file for complete search history.

(56) References Cited

U.S. PATENT DOCUMENTS

| | | | | |
|---|---|---|---|---|
| 4,131,488 | A * | 12/1978 | Lesk et al. ..................... | 438/71 |
| 4,617,722 | A * | 10/1986 | Willis ............................ | 438/61 |
| 7,071,407 | B2 | 7/2006 | Faterni et al. | |
| 2003/0070707 | A1* | 4/2003 | King et al. ................... | 136/255 |
| 2005/0172997 | A1 | 8/2005 | Meier et al. | |
| 2006/0162766 | A1 | 7/2006 | Gee et al. | |
| 2006/0231130 | A1 | 10/2006 | Sharps et al. | |
| 2007/0186971 | A1 | 8/2007 | Lochun et al. | |
| 2008/0011349 | A1* | 1/2008 | Raffaele et al. ............... | 136/249 |

FOREIGN PATENT DOCUMENTS

| | | |
|---|---|---|
| EP | 1953828 A1 | 8/2008 |
| JP | 2001-118758 | 4/2001 |
| JP | 2003-285360 | 10/2003 |
| JP | 2004-95669 | 3/2004 |

(Continued)

OTHER PUBLICATIONS

English language translation of JP 2004-095669, pp. 1-11.*
Canadian Office Action for Application No. 2,744,706, 3 pages, dated Feb. 6, 2014.
Taiwan Search Report for Application No. 098140343, 1 page, dated Jul. 29, 2014.

(Continued)

*Primary Examiner* — Alexander Kollias
(74) *Attorney, Agent, or Firm* — Nelson Mullins Riley & Scarborough LLP; Anthony A. Laurentano

(57) ABSTRACT

A solar cell structure is provided for reducing shadow losses without increasing series resistance in the solar cell device. The solar cell device may form an electrical contact to a solar cell emitter layer from the backside of the solar cell device. With this structure, the emitter contact shadow losses may be reduced significantly while simultaneously decreasing device series resistance.

10 Claims, 5 Drawing Sheets

(56) References Cited

FOREIGN PATENT DOCUMENTS

| | | |
|---|---|---|
| JP | 2007-110123 | 4/2007 |
| JP | 2007-134655 | 5/2007 |
| JP | 2008-193089 | 8/2008 |
| TW | 200534351 | 10/2005 |
| WO | 2005/098956 | 10/2005 |

OTHER PUBLICATIONS

Canadian Office Action for Application No. 2,744,706, 3 pages, dated Feb. 22, 2013.

Japanese Office Action for Application No. 2011-538700, 6 pages, dated Nov. 27, 2012.

International Search Report and Written Opinion for Application No. PCT/US09/65982, dated Jan. 21, 2010.

* cited by examiner

SOLAR CELL WITH A BACKSIDE VIA TO CONTACT THE EMITTER LAYER

RELATED APPLICATION

This application claims priority to, and the benefit of, U.S. provisional patent application No. 61/118,296 filed on Nov. 26, 2008, the content of which is herein incorporated by reference in its entirety.

This invention was made with Government support under FA9453-09-C-0365 awarded by Air Force Research Laboratory. The Government has certain rights in the invention.

BACKGROUND

The present application concerns photovoltaic devices, such as solar cell devices. More specifically, the present application concerns photovoltaic devices with backside contact to a buried semiconductor layer, such as an emitter layer.

A photovoltaic device converts light energy into electricity. Although the term "solar cell device" may sometimes be used to refer to a device that captures energy from sunlight, the terms "solar cell device" and "photovoltaic device" are interchangeably used in the present application regardless of the light source.

FIG. 1 is a cross-sectional view of a conventional multi-junction solar cell device 100. The multi-junction solar cell device 100 may include multiple junction regions, such as the first p-n junction region 110, the second p-n junction region 120, and the third p-n junction region 130, which are connected in series. Each p-n junction region may contain multiple layers including an emitter layer and a base layer (not shown).

The multi-junction solar cell device 100 may receive light from the front or top (illuminated) side of the device. The multi-junction solar cell device 100 may include emitter "grid" contacts 140 on the front or top side of the device 100, which may contact the emitter layer of the first junction region 110. The multi-junction solar cell device 100 may also include base contacts 150 on the backside or bottom (non-illuminated) surface of the device 100, which may contact the base layer of the third junction region 130.

Electrical connection to the device 100 may be made through the emitter "grid" contacts 140 and the base contacts 150. The base contacts 150 may cover the entire backside surface of the device 100, while the emitter "grid" contacts 140 may consist of an array of fingers or buses that collect current from the top or front side of the device 100. An antireflection coating 160 may be deposited over the exposed top surface of the emitter layer of the first junction region 110 to minimize losses due to reflections.

In the conventional multi-junction solar cell device 100, the area shadowed by the top grid contact 140 may cause a significant loss in device efficiency, because no light is absorbed in the shadowed area. The metal fingers of the top grid contact 140 may cover at least 5% of the top surface of the device 100, which is significant. Conventional methods for minimizing the shadowed area are extremely limited due to the performance trade-off between the shadowed area and associated resistive losses. In other words, reducing the area of grid metal covering the surface of the solar cell device 100 may decrease the shadow losses, but it increases the series resistance in the device 100. Particularly in high current applications, such as optical concentrator systems, this series resistance becomes a key factor that limits overall device efficiency.

Accordingly, a new solar cell structure is needed for reducing shadow losses without unnecessarily increasing the series resistance of the solar cell device.

SUMMARY

An embodiment of the present application may provide a solar cell structure for reducing shadow losses without increasing the series resistance in the solar cell device. The solar cell device includes a contact to a buried solar cell layer, such as an emitter layer, from the backside of the solar cell device. The backside of the solar cell device refers to the non-illuminated side of the solar cell device in the description of the present application. With this structure, the embodiment of the present application may significantly reduce emitter contact shadow losses while simultaneously and advantageously reducing the device series resistance.

In accordance with one embodiment, a solar cell device includes at least one junction region having an emitter region and a base region. The solar cell device may also include a via hole extending axially from the bottom surface of the device into the junction region and terminating in the junction region without extending completely through the junction region. The solar cell device may further include an insulating layer formed on an inner surface of the via hole, and a conductive layer formed on the insulating layer.

In accordance with another embodiment of the present application, a solar cell device includes a first junction region having an emitter region and a base region, and a second junction region having an emitter region and a base region. The solar cell also includes a first via hole extending axially from the base region of the second junction region into emitter region of the first junction region and terminating in the emitter region of the first junction region, a first insulating layer formed on an inner surface of the first via hole, and a first conductive layer formed on the first insulating layer on the inner surface of the first via hole to electrically couple the emitter region of the first junction region and the base region of the second junction region through an external load. The solar cell further includes, according to certain embodiments, a second via hole extending axially from the base region of the second junction region into the emitter region of the second junction region and terminating in the emitter region of the second junction region, a second insulating layer formed on an inner surface of the second via hole, and a second conductive layer formed on the second insulating layer of the second via hole to electrically couple the emitter region of the second junction region and the base region of the second junction region through an external load.

In accordance with another embodiment of the present application, a method is provided for forming a solar cell device with an emitter layer, a base layer and a junction or interface between the emitter layer and the base layer. A via hole is formed so as to extend axially from the bottom surface of the device into the junction region and terminate in the junction region. An insulating layer is formed on an inner surface of the via hole, and a conductive layer on the insulating layer.

In accordance with still another embodiment of the present application, a method is provided for forming a solar cell device with a first junction region having an emitter region and a base region, and a second junction region having an emitter region and a base region. A first via hole extends axially from the base region of the second junction region into emitter region of the first junction region and terminates in the emitter region of the first junction region. A first insulating layer is formed on an inner surface of the first via hole, and a first conductive layer on the first insulating layer on the inner surface of the first via hole to electrically couple the emitter region of the first junction region and the base region of the second junction region. A second via hole is formed to extend axially from the base region of the second junction region into the emitter region of the second junction region and terminate in the emitter region of the second junction region. A second insulating layer is formed on an inner surface of the second via hole, and a second conductive layer on the second insulating layer of the second via hole to electrically couple the emitter region of the second junction region and the base region of the second junction region.

BRIEF DESCRIPTION OF THE FIGURES

These and other characteristics of the present application will be more fully understood by reference to the following detailed description in conjunction with the attached drawings, in which.

DESCRIPTION

Embodiments of the present application provide solar cell device structures and methods for forming the solar cell device structures. In the solar cell devices, an electrical contact to a solar cell emitter layer is provided from the backside (non-illuminated side) of the solar cell device. These structures and methods reduce emitter contact shadow losses while concomitantly reducing the device series resistance.

Figure 1:
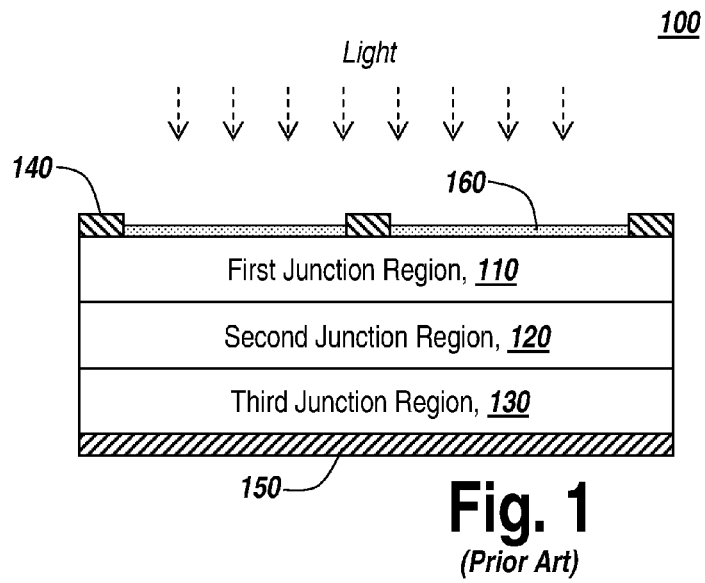
FIG. 1 is a schematic cross-sectional view of a conventional multi-junction solar cell device.
Figure 2:
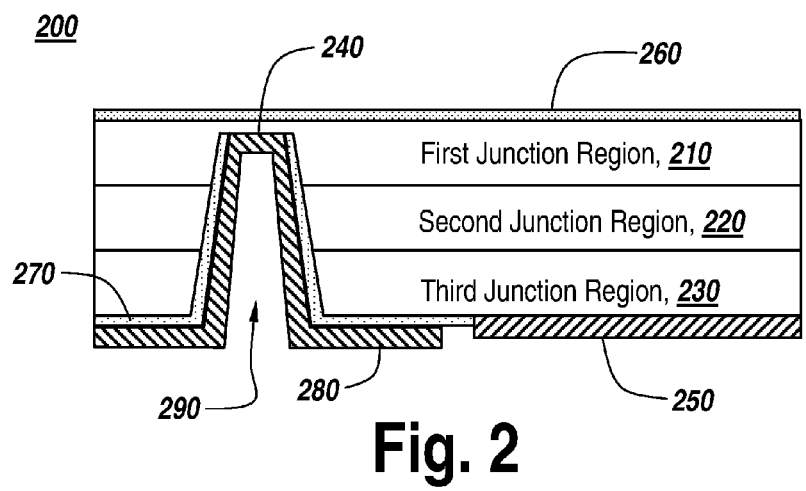
FIG. 2 is a schematic cross-sectional view of a multi-junction solar cell structure with a backside emitter contact according to one embodiment of the present application.

FIG. 2 is a schematic cross-sectional diagram of an exemplary multi-junction solar cell device 200 suitable for use with the backside via holes of the present application. The multi-junction solar cell device 200 may include a first or top junction region 210, a second or middle junction region 220, and a third or bottom junction region 230. Those of ordinary skill in the art will appreciate that the multi-junction solar cell device 200 is exemplary and that any number of junctions can be employed in the illustrated solar cell device. For example, the illustrated solar cell device can include a single-junction or more, such as two or three junctions. Those of ordinary skill will also readily understand the various layers that comprise each junction of the solar cell device 200.

Each junction region 210, 220, 230 of the illustrated solar cell device can be formed of one or more III-V compounds, such as Gallium Arsenide (GaAs), Gallium Indium Phosphide (GaInP), Gallium Indium Arsenide (GaInAs), Gallium Iridium Arsenide Phosphide (GaInAsP), or any other suitable III-V compound. Each junction region may contain an emitter region, a base region, and a junction between the emitter region and the base region. The emitter region may include an emitter layer formed of an n-type III-V compound and the base region may include a base layer formed of a p-type III-V compound. The emitter layer and the base layer may be formed of a p-type III-V compound and an n-type III-V compound, respectively, in other embodiments. Those of ordinary skill will readily recognize that each junction region can have a certain band gap energy characteristic, which uses a certain portion of the solar spectrum to generate electricity. The junction regions in the multi-junction solar cell device 200 may be formed of different doping and material so that the multiple junction regions may have different band-gaps to absorb different wavelengths of the solar spectrum. For example, the first junction region 210, the second junction region 220 and the third junction region 230 may be formed of GaAs, GaInP and GaInAs, respectively. Therefore, the first junction region 210, the second junction region 220 and the third junction region 230 may absorb different wavelengths of the solar spectrum.

The junction regions may be formed on a substrate and lifted off the substrate using epitaxial lift-off (ELO) methodologies. The ELO methodologies are described in detail in United State Patent Application Publication No. 2009/0038678 A1, the contents of which are herein incorporated by reference. The junction regions may also be formed using other well-known methodologies. For example, the junction regions may be epitaxially grown on substrates and remain affixed thereto throughout fabrication and deployment as a solar cell.

Figure 8A:
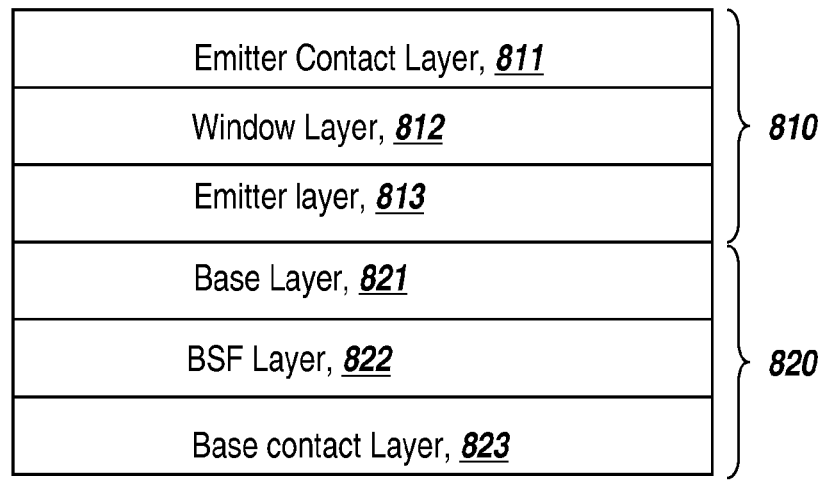
FIGS. 8A and 8B are schematic cross-sectional diagrams illustrating the possible various layers of exemplary solar cell devices suitable for use with the present invention.
Figure 8B:
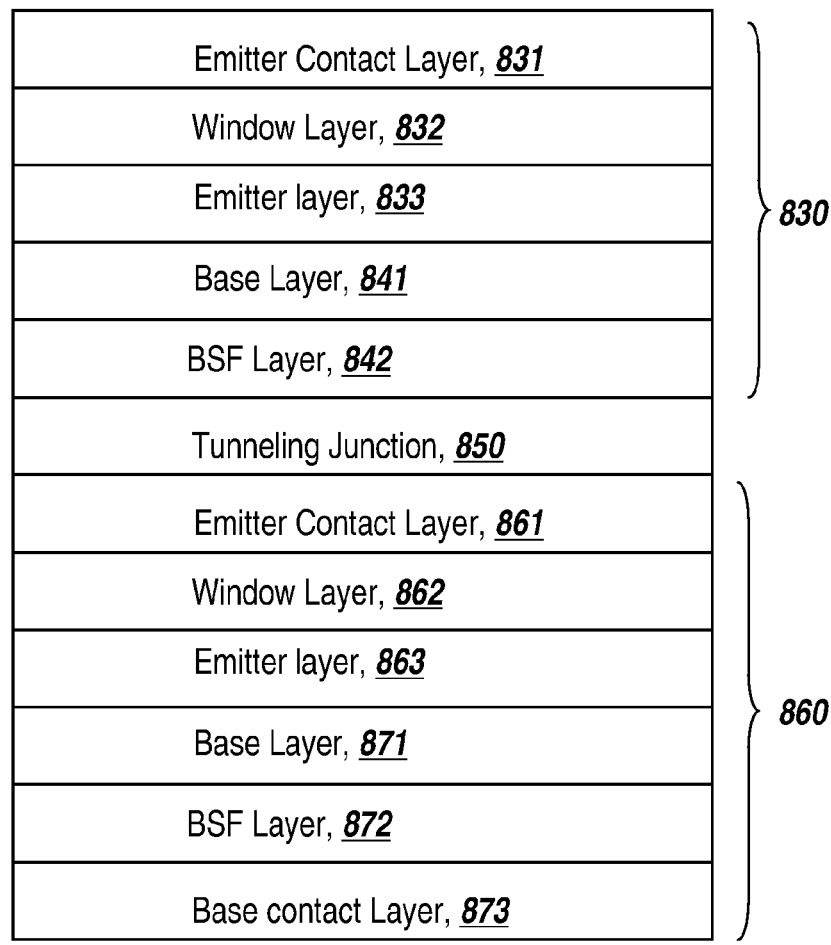

In the illustrative embodiment, the solar cell device 200 includes a backside via hole 290 formed so as to contact a selected junction region, for example, the first junction region 210. Further, the via hole 290 can be formed so as to terminate at or within a selected region or layer of the junction region. FIGS. 8A and 8B illustrate various layers that can comprise the solar cell device. The illustrated layers are simplified for purposes of illustration and discussion. FIGS. 8A and 8B will be described in further detail below. With reference to FIGS. 2, 8A and 8B, the via hole 290 can terminate at or within the emitter region of the first or top junction region 210 furthest from the base region of the third or bottom junction region 230. Those of ordinary skill in the art will appreciate that the structure of the via hole 290 is exemplary and that the via hole may terminate at or within any of the other junction or regions or, layers or regions of the junction regions, such as at or within the emitter region of the second or third junction region. Furthermore, those of ordinary skill in the art will appreciate that the via hole 290 may terminate at or within any of the layers in the emitter region, for example, at or within the emitter contact layer. Those of ordinary skill in the art will also appreciate that a plurality of via holes at various locations may be formed in the solar cell device 200, as described below with reference to FIGS. 3-5.

The illustrative embodiment of the present application provides a contact 240 to the emitter region or layer by forming the emitter contact via hole 290 from the backside of the solar cell device 200. The emitter contact via hole 290 may be formed by well-know etching methodologies, such as wet-etching or dry-etching methodologies. According to the teachings of the present invention, the via hole 290 may be formed only partially through the solar cell device 200 and terminates or stops at or within the selected emitter region. Although the etched via hole 290 extends from the backside of the device 200 into the emitter region and terminates at or within the emitter region, the via hole 290 does not extend completely through to the front or top (illuminated) side of the device 200.

An insulating layer 270 is formed on the sidewalls of the via hole 290 and on at least a portion of a bottom surface of the base region in the third junction region. The insulating layer 270 may be formed of $SiO_2$ or other suitable insulating material. One of ordinary skill in the art will appreciate that the insulating layer 270 may be formed using well-known techniques, such as plasma-enhanced chemical vapor deposition (PECVD). The insulating layer 270 insulates the conductive layer 280 from the sidewall of the via hole 290 and the bottom surface of the third junction region 230.

The conductive layer 280 is formed on the insulating layer 270. The contact 240 is formed between the conductive layer 280 and the emitter region or layer of the first junction region 210 so that the conductive layer 280 is electrically connected to the emitter layer of the first junction region 210. Another conductive layer (backside contact 250) is formed on the bottom surface of the third junction region 230. The backside contact 250 contacts the base region of the third junction region 230 so that the backside contact 250 is electrically connected to the base layer of the third junction region 230. One of ordinary skill in the art will appreciate that the conductive layers may be formed using well-known techniques, such as the well-known plating techniques. The contacts 250 and 240 can be electrically coupled through an external load (not shown).

An antireflection coating 260 may be deposited over the top surface of the solar cell device 200, for example, over the emitter region of the first junction region to minimize losses due to reflections. The antireflection coating 260 may be a zinc sulfide/magnesium fluoride coating. One of ordinary skill in the art will appreciate that the antireflection coating 260 can be implemented using other suitable antireflection coatings or combinations of coatings or materials.

With the above structure, since the contact on the illuminated side of the solar cell device is removed or eliminated, the illustrative embodiment provides the advantages of reducing or eliminating the emitter contact shadow losses. The illustrative embodiment also provides the advantages of reducing the device series resistance by providing an emitter contact from the non-illuminated side of the solar cell device, which does not limit the size of the emitter contact.

In operation, the multiple junctions are connected in series and receive light from the top or front side of the solar cell device 200. An electric potential is generated between the emitter layer of the first junction region 210 and the base layer of the third junction region 230. This potential allows electric current to flow through the conductive layer 280 when an electric circuit is formed between the conductive layer 280 and the base contact 250.

In FIG. 2, the multi-junction solar cell device 200 is depicted in simplified form. However, those skilled in the art will appreciate that the solar cell device 200 may contain additional layers, for example, tunnel junctions, backside field (BSF) layers and window layers, such as illustrated in FIGS. 8A and 8B. A substrate may also be provided beneath the third junction region.

Figure 3:
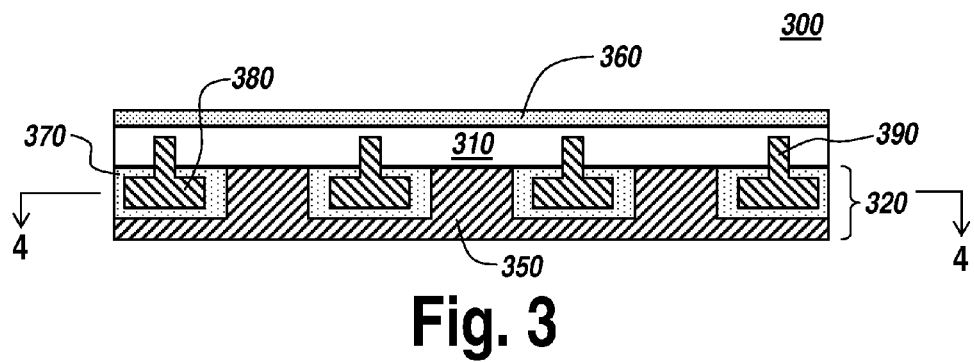
FIG. 3 is a schematic cross-sectional view of an exemplary solar cell device with an array of backside emitter contacts according to the teachings of the present invention.

FIG. 3 is a cross-sectional view of an exemplary solar cell device 300 employing an array of backside emitter contact via holes 390. An array of backside emitter contact via holes 390 may be implemented for both space and terrestrial applications. For example, an array of backside emitter contact via holes 390 may be implemented in a solar cell device for high concentration applications. The structure of each via hole has substantially the same structure as depicted in FIG. 2. Therefore, the insulation layer formed on the sidewall of the via hole are not shown in FIG. 3. Those of ordinary skill will readily recognize that the hole can be arranged in any suitable pattern and number depending upon the particular application.

In the exemplary solar cell device 300, the via holes 390 may be formed in the junction region 310 in a grid pattern. The junction region 310 may include a single junction. In a different embodiment, the junction region 310 may include multiple junctions. The depth of the via holes 390 may be the same or different. An embodiment with different depth via holes will be described below in more detail with reference to FIG. 5.

A backside contact layer 320 is provided on the bottom surface of the junction region 310. The backside contact layer 320 includes a base contact 350 that contacts the base region of the junction region 310 so that the base contact 350 is electrically connected to the base region of the junction region 110. The backside contact layer 320 also includes a emitter contact grid 380 that contacts the conductive layers formed on the sidewall of the via hole holes 390. The emitter contact grid 380 is insulated from the base contact 350 by the insulating material 370. The emitter contact grid 380 is interconnected by a contact pad, which will be described below in more detail with reference to FIG. 4.

An antireflection coating 360 may be deposited over the top surface of the solar cell device 300 to minimize losses due to reflections. The antireflection coating 360 may be a zinc sulfide/magnesium fluoride coating or other suitable antireflection coating.

In operation, the junction region 310 receives light from the top or front side of the solar cell device 300. Electric potential is generated between the emitter layer and the base layer of the junction region. This potential allows electric current to flow through the emitter contact grid 380 when an electric circuit (external load) is formed between the emitter contact grid 380 and the base contact 350.

Figure 4:
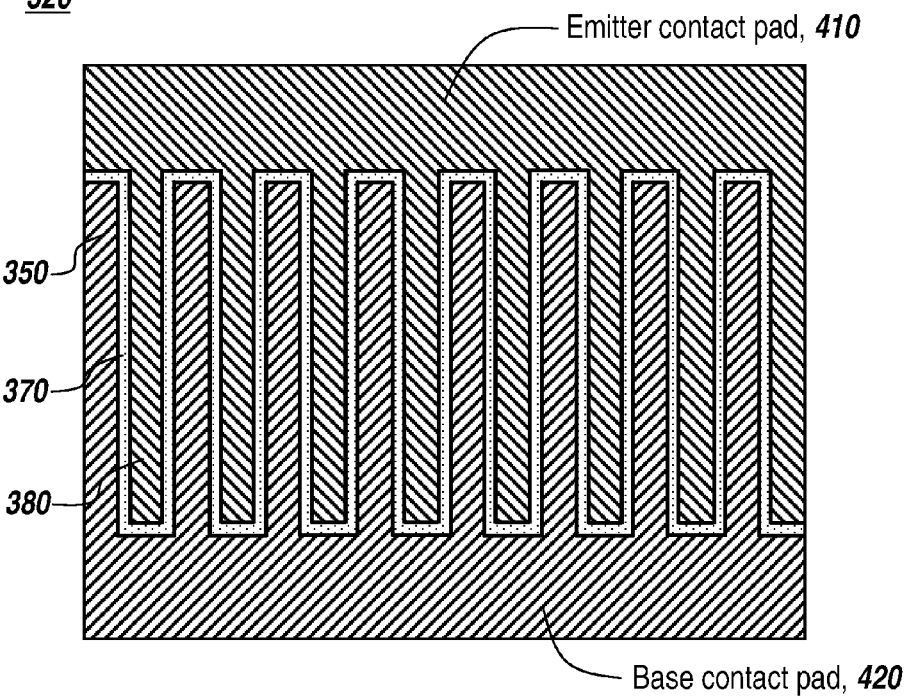
FIG. 4 is a cross-sectional view of the backside contact layer as seen from the 4-4 line depicted in FIG. 3.

FIG. 4 depicts a cross-sectional view of the backside contact layer 320 as seen from the 4-4 line depicted in FIG. 3. In the exemplary backside contact layer 320, the emitter contact grid 380 is interconnected by the large, horizontal contact pad 410 at the top edge of the device ("emitter contact pad"). The base contact 350 also includes a large, horizontal contact pad 420 at the bottom edge of the device ("base contact pad"). The emitter contact grid 380 is insulated from the base contact 350 by the insulating material 370 and provided between the base contacts 350 in an alternating manner.

In the illustrative embodiment of the present application, the emitter contact grid 380 can be made as wide and thick as necessary because there are no shadowing constraints on the backside of the solar cell. The emitter contact grid 380 is interconnected using a low-resistance backside contact pad 410. With the emitter contact grid 380 having 10-μm diameters and regular spacing on a 100-μm grid, it is calculated that the solar cell suffers a shadow loss of approximately 1%.

In particular, external connection to the emitter contact pad 410 and the base contact pad 420 is possible from only the backside of the device. Therefore, the backside contact layer of the present application provides efficient device packaging configurations in both space and terrestrial applications.

Figure 5:
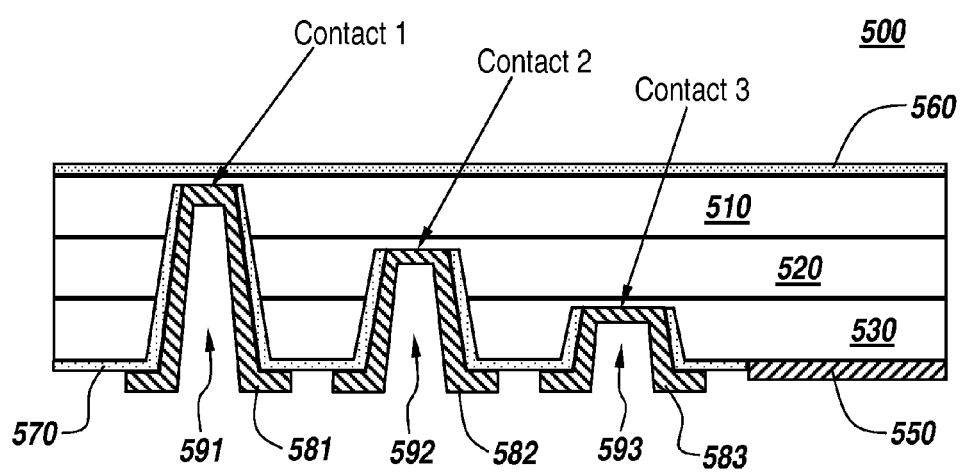
FIG. 5 is a schematic cross-sectional view of a multi-junction solar cell device employing multiple via holes with different depths according to the teachings of the present application.

FIG. 5 is an exemplary solar cell device 500 including multiple via holes with different depths in another illustrative embodiment of the present application. The solar cell device 500 may include the first junction region 510, the second junction region 520, and the third junction region 530. Each junction region may include an emitter region, a base region, and a junction between the emitter region and the base region. The solar cell device 500 may include any suitable number of via holes, such as via holes 591, 592 and 593. According to the illustrated exemplary embodiments, the first via hole 591 terminates at or within the emitter region of the first or top junction region 510, the second via hole 592 terminates at or within the emitter region of the second or middle junction region 520, and the third via hole 593 terminates at or within the emitter region of the third or bottom junction region 530. The illustrated via holes 591, 592 and 593 provide electrical connections to different emitter regions within the device 500.

Those of ordinary skill in the art will appreciate that the emitter contact via holes 591, 592 and 593 are illustrative and a plurality of emitter contact via holes may terminate in different regions or layers of the various junction region.

An insulating material 570 is formed on the sidewalls of the via holes 591, 592 and 593 and on at least a portion of a bottom surface of the base region of the third junction region 530. Conductive layers 581, 582 and 583 are formed on the insulating layer 570 and provide electrical contacts to the emitter layers of the first, second and third junction regions, respectively. An antireflection coating 560 may be deposited over the emitter region of the first junction region 510 to minimize losses due to reflections.

In the illustrative embodiment, the device 500 includes multiple via holes that contact different emitter layers in different junction regions. In this structure, multiple junctions may be combined with series-parallel connections rather than the conventional series connection. The above structure may improve spectral robustness and efficiency of the solar cell device 500.

Figure 6:
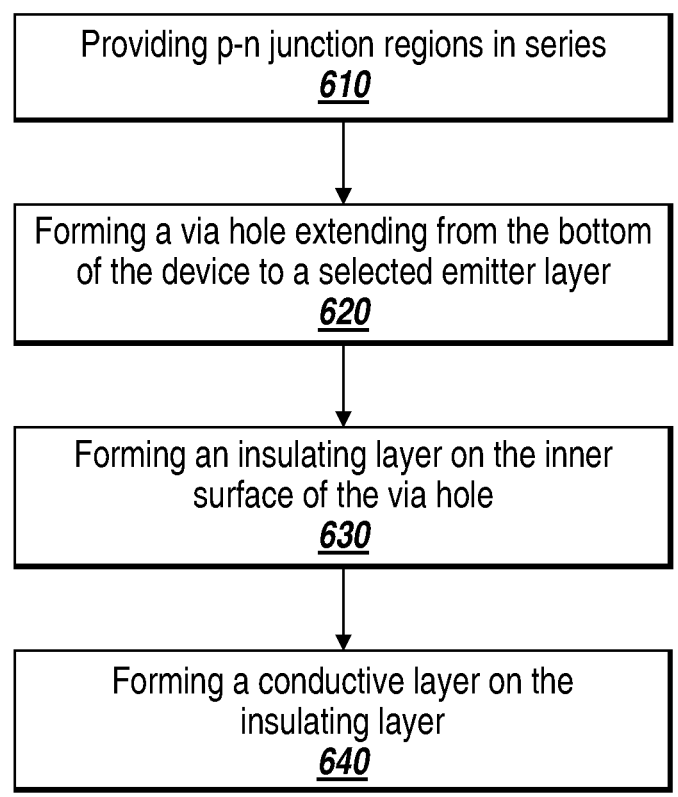
FIG. 6 is a schematic flow chart diagram depicting the steps for fabricating a single or multi-junction solar cell device employing a backside via hole according to the teachings of the present application.

FIG. 6 is a schematic flow chart diagram of an exemplary method for fabricating the solar cells in accordance with the teachings of the present application. In accordance with an embodiment of the present application, multiple p-n junctions regions are provided in series to form a solar cell device (step 610). Each p-n junction region may include an emitter region and a base region to form a p-n junction between the regions. A via hole is formed to extend from the bottom of the device into a selected emitter region of the multiple p-n junctions regions (step 620). An insulating layer is formed on the inner surface of the via hole (step 630). A conductive layer is formed on the insulating layer to electrically couple the emitter region and the base region that contacts the bottom of the device (step 640).

Those skilled in the art will appreciate that any number of the p-n junctions regions can be employed in the solar cell device of the present application. Furthermore, those skilled in the art will appreciate that any suitable number of via holes may be formed in the solar cell device of the present application, as described below with reference to FIG. 7.

Figure 7:
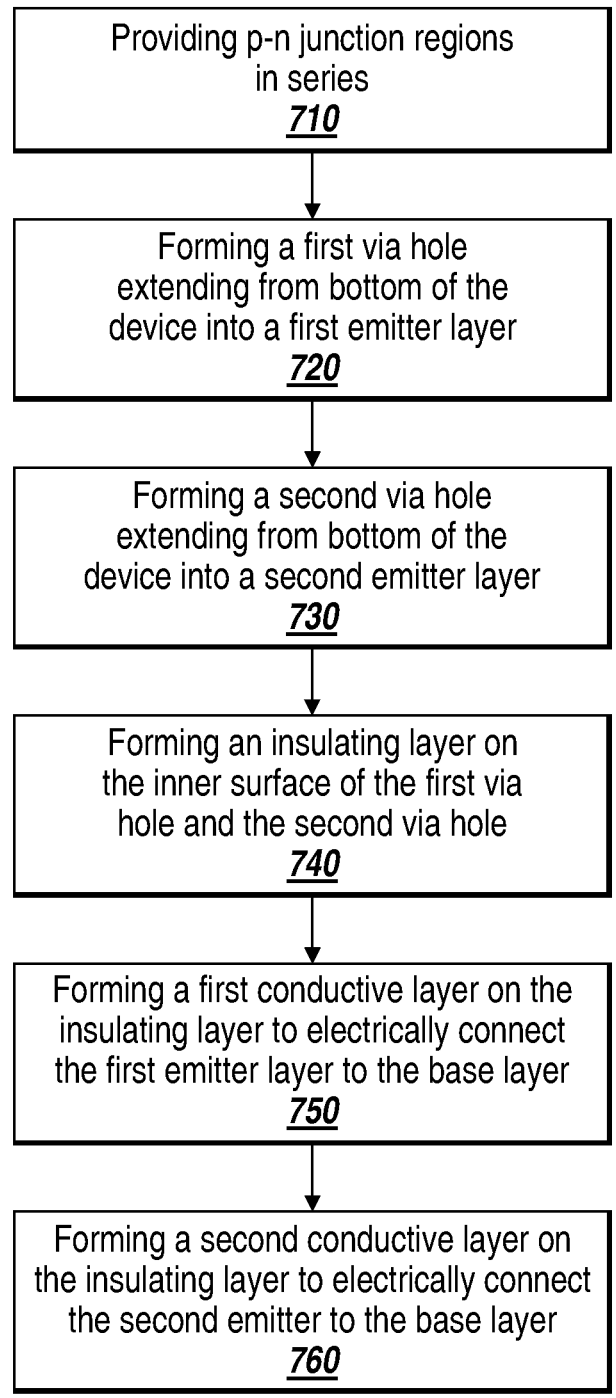
FIG. 7 is a schematic flow chart diagram depicting the steps for fabricating a single or multi-junction solar cell device employing multiple backside via holes according to the teachings of the present application.

FIG. 7 is a schematic flow chart diagram of another exemplary method for fabricating the solar cells in accordance with the teachings of the present application. In accordance with this embodiment of the present application, a first junction region having an emitter region and a base region, and a second junction region having an emitter region and a base region are provided in series to form a solar cell device (step 710). A first via hole is formed to extend from the base region of the second junction region into the emitter region of the first junction region and to terminate in the emitter region of the first junction region (step 720). A second via hole is provided to extend from the base region of the second junction region into the emitter region of the second junction region and to terminate in the emitter region of the second junction region (step 730). An insulating layer is formed on an inner surface of the first via hole and the second via hole (step 740). A first conductive layer is formed on the insulating layer on the inner surface of the first via hole to electrically couple the emitter region of the first junction region and the base region of the second junction region (step 750). A second conductive layer is formed on the insulating layer of the second via hole to electrically couple the emitter region of the second junction region and the base region of the second junction region (step 760).

FIG. 8A shows an exemplary single junction solar cell suitable for use with the teachings of the present application. The single junction solar cell includes, for example, a junction between the emitter region 810 and the base region 820. The emitter region 810 may be deposited over the base region 820.

The emitter region 810 may include an emitter contact layer 811, a window layer 812, and/or an emitter layer 813. The doped emitter contact layer 811 may be deposited over the window layer 812 to enhance the electrical contact with a metal conductive material, such as the conductive layer 280 depicted in FIG. 2. The window layer 812 may be deposited over the emitter layer 813 to allow the light to reach the emitter layer 820 and help effectively separate the electrons and holes before they can recombine.

The base region 820 may include a base layer 821, a backside field (BSF) layer 822, and/or a base contact layer 823. The base layer 821 may be deposited over the BSF layer 822. The BSF layer 822 may be deposited over the base contact layer 823 to reduce recombination loss at the backside of the solar cell. The doped base contact layer 823 may enhance contact with a metal material, such as the backside contact 250 in FIG. 2.

In the illustrative embodiment, one or more via holes terminate at or within any of the regions in the illustrated junction region. Preferably, one or more via holes terminate at or within any of the layers in the emitter region 810. Most preferably, one or more via holes terminate at or within the emitter contact layer of the emitter region 810.

FIG. 8B shows an exemplary multi-junction solar cell device suitable for use with the teachings of the present invention. The multi-junction solar cell device may include a first junction region 830 and a second junction region 850. The first junction region 830 may include an emitter contact layer 831, a window layer 832, an emitter layer 833, a base layer 841, and/or a BSF layer 842, which can be separated into emitter regions and base regions as shown in FIG. 8A. The second junction region 860 may include an emitter contact layer 861, a window layer 862, an emitter layer 863, a base layer 871, a BSF layer 872, and/or a base contact layer 873, which can be separated into emitter regions and base regions as shown in FIG. 8A. A tunneling junction layer 850 is deposited between the first junction region 830 and the second junction region 850. The tunneling junction layer 850 may form a tunneling diode to allow the flow of electrons between the first junction region 830 and the second junction region 850.

In the illustrative embodiment, one or more via holes may terminate at or within any of the junction regions. Preferably, one or more via holes terminate at or within any of the layers in the emitter regions. Most preferably, one or more via holes may terminate at or within the emitter contact layers in the emitter regions. Those of ordinary skill will readily recognize that the via holes can terminate in any other region or layer of the junction regions.

One of ordinary skill in the art will appreciate that the structure of the junction region is not limited to the configuration illustrated in FIGS. 8A and 8B, and the junction region may include one or more different layers. For example, the junction region may not include the window layer or the BSF layer.

One of the advantages of the present application is that the reduction of shadow losses is possible. Furthermore, the device series resistance may also be reduced while the shadow losses are reduced.

Numerous modifications and alternative embodiments of the present application will be apparent to those skilled in the art in view of the foregoing description. Accordingly, this description is to be construed as illustrative only and is for the purpose of teaching those skilled in the art the best mode for carrying out the present application. Details of the structure may vary substantially without departing from the spirit of the present application, and exclusive use of all modifications that come within the scope of the appended claims is reserved. It is intended that the present application be limited only to the extent required by the appended claims and the applicable rules of law.

It is also to be understood that the following claims are to cover all generic and specific features of the invention described herein, and all statements of the scope of the invention that, as a matter of language, might be said to fall therebetween.

The invention claimed is:

1. A photovoltaic device, comprising:
   at least one junction region, wherein the junction region comprises an emitter region and a base region, wherein the emitter region of the junction region comprises an emitter contact layer, a window layer, and an emitter layer;
   a via hole formed in the junction region and extending axially from a bottom backside non-illuminated surface of the device into the junction region and terminating within the junction region without extending completely through the junction region to reach a top illuminated surface of the junction region, and wherein the via hole terminates at or within the emitter contact layer;
   an insulating layer directly contacting at least a part of an inner surface of the via hole; and
   a conductive layer directly contacting the insulating layer and directly contacting the junction region.

2. The photovoltaic device of claim 1, wherein the photovoltaic device is a solar cell device.

3. The photovoltaic device of claim 1, further comprising a backside contact layer having an emitter contact pad, a plurality of emitter contact bars extending from the emitter contact pad, a base contact pad, and a plurality of base contact bars extending from the base contact pad.

4. The photovoltaic device of claim 1, further comprising a plurality of via holes terminating within the junction region.

5. The photovoltaic device of claim 4, wherein the plurality of via holes are provided in a grid pattern.

6. The photovoltaic device of claim 1, further comprising a plurality of junction regions, wherein each of the plurality of junction regions includes an emitter region and a base region, and wherein the via hole terminates within the emitter region or the base region of one of the plurality of junction regions.

7. The photovoltaic device of claim 6, wherein the emitter region of one of the plurality of junction regions includes an emitter contact layer, a window layer, and an emitter layer, and the via hole terminates at or within the emitter contact layer.

8. The photovoltaic device of claim 6, further comprising a plurality of via holes, wherein each of the via holes terminates in the emitter or base regions of one of the plurality of junction regions.

9. The photovoltaic device of claim 8, wherein each of the plurality of via holes terminates in the emitter region of one of the plurality of junction regions.

10. The photovoltaic device of claim 9, wherein the emitter region of each of the plurality of junction regions includes an emitter contact layer, and wherein the plurality of via holes terminate at or within the emitter contact layers of the plurality of junction regions.

* * * * *